(12) United States Patent
Sung et al.

(10) Patent No.: US 10,886,502 B2
(45) Date of Patent: Jan. 5, 2021

(54) BARRIER, BARRIER MANUFACTURING METHOD, DISPLAY INCLUDING BARRIER, AND METHOD OF MANUFACTURING DISPLAY INCLUDING BARRIER

(71) Applicant: IUCF-HYU (INDUSTRY-UNIVERSITY COOPERATION FOUNDATION HANYANG UNIVERSITY), Seoul (KR)

(72) Inventors: Myung Mo Sung, Seoul (KR); Lynn Lee, Ansan-si (KR); Hong Ro Yoon, Wonju-si (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 0 days.

(21) Appl. No.: 16/223,634

(22) Filed: Dec. 18, 2018

(65) Prior Publication Data

US 2020/0106043 A1    Apr. 2, 2020

(30) Foreign Application Priority Data

Sep. 27, 2018    (KR) .................... 10-2018-0114735

(51) Int. Cl.
*H01L 51/52* (2006.01)
*B32B 27/00* (2006.01)
(Continued)

(52) U.S. Cl.
CPC .......... *H01L 51/5253* (2013.01); *B32B 27/00* (2013.01); *C08J 5/18* (2013.01); *H01L 27/3244* (2013.01); *H01L 51/524* (2013.01)

(58) Field of Classification Search
CPC ............ H01L 51/5253; H01L 27/3244; H01L 51/524; H01L 1127/3244; H01L 51/5096;
(Continued)

(56) References Cited

U.S. PATENT DOCUMENTS

2014/0252342 A1* 9/2014 Ramadas ............... B82Y 30/00
257/40
2015/0284844 A1* 10/2015 Suzuki ................. C23C 16/402
428/337

(Continued)

FOREIGN PATENT DOCUMENTS

KR    10-2017-0123752    11/2017

OTHER PUBLICATIONS

Ref. 1 "PMT—5783—Fundamentos De Ciência E Engenharia De Materials—2015" (Year: 2015).*
(Continued)

*Primary Examiner* — Yasser A Abdelaziez
(74) *Attorney, Agent, or Firm* — Sughrue Mion, PLLC

(57) ABSTRACT

A barrier according to an embodiment of the present invention is provided. The barrier includes a polymer configured of a plurality of first atoms; and an inorganic material configured of a plurality of second atoms and coexisting with the organic material, wherein an atomic planar density defined by the number of atoms per $cm^2$ of the first atoms and the second atoms exceeds $1.9 \times 10^{17}$ atoms/$cm^2$.

13 Claims, 10 Drawing Sheets
(5 of 10 Drawing Sheet(s) Filed in Color)

(51) Int. Cl.
*C08J 5/18* (2006.01)
*H01L 27/32* (2006.01)

(58) Field of Classification Search
CPC ........ H01L 51/56; H01L 51/0002; C08J 5/18;
C08J 2379/08; C08J 7/06; B32B 27/00
See application file for complete search history.

(56) References Cited

U.S. PATENT DOCUMENTS

2016/0172625 A1* 6/2016 Mukai ................. H01L 51/5253
428/336
2016/0351443 A1* 12/2016 George .................... B01J 23/38
2019/0062917 A1 2/2019 Sung et al.

OTHER PUBLICATIONS

El-Meligy et al. ("Effect of variation of aluminum oxide concentration on the modified novolac stalk composite," ISRN Chemical Engineering, vol. 2012, Article ID 263975, p. 1-7, 2012) (Year: 2012).*

Si et al. ("Polydirnethylsiloxane/alurninurn oxide composites prepared by spatial confining forced network assembly for heat conduction and dissipation," RSC Adv, 8, 36007-36014, 2018) (Year: 2018).*

* cited by examiner

[Fig. 1(a)]
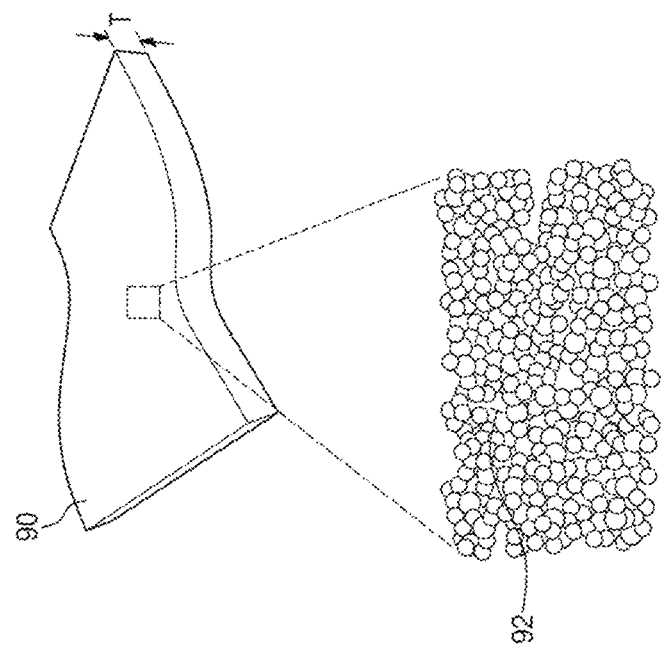
[Fig. 1(b)]
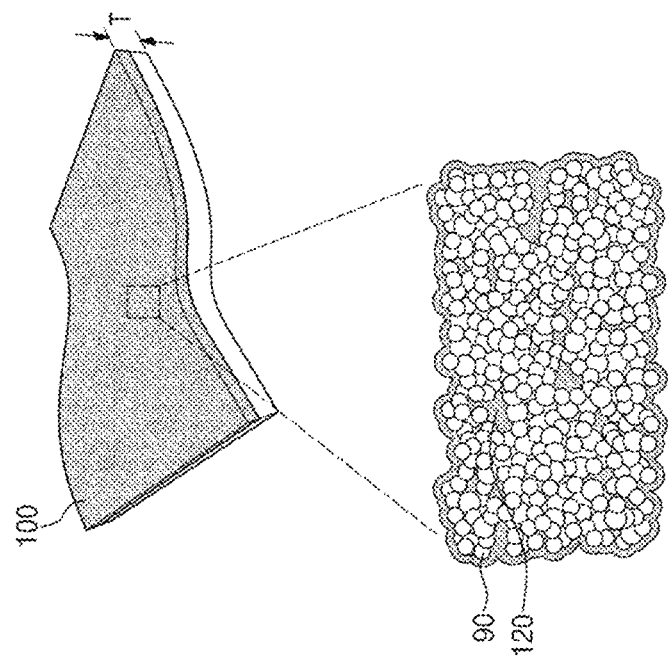

[Fig. 2]
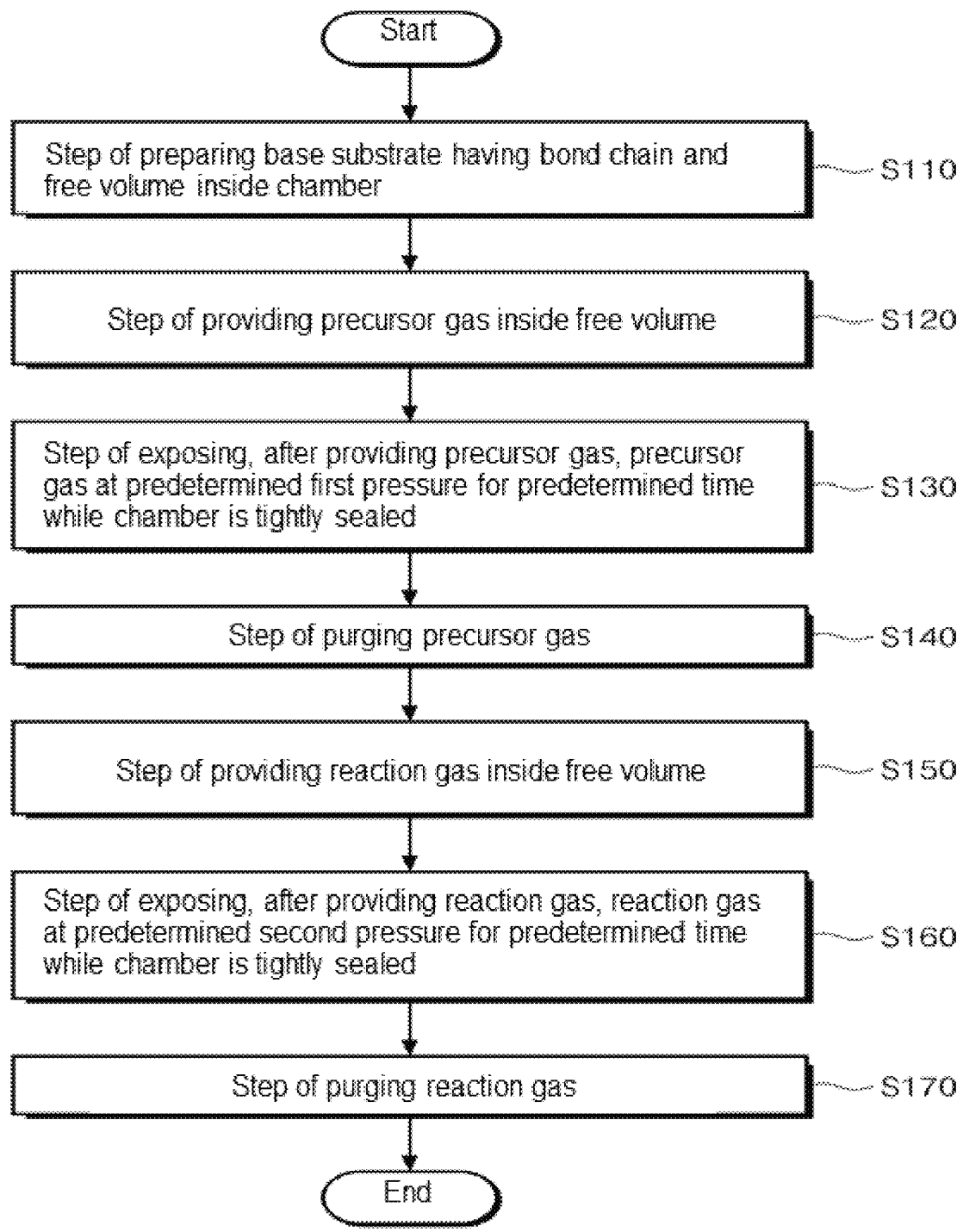

[Fig. 3]
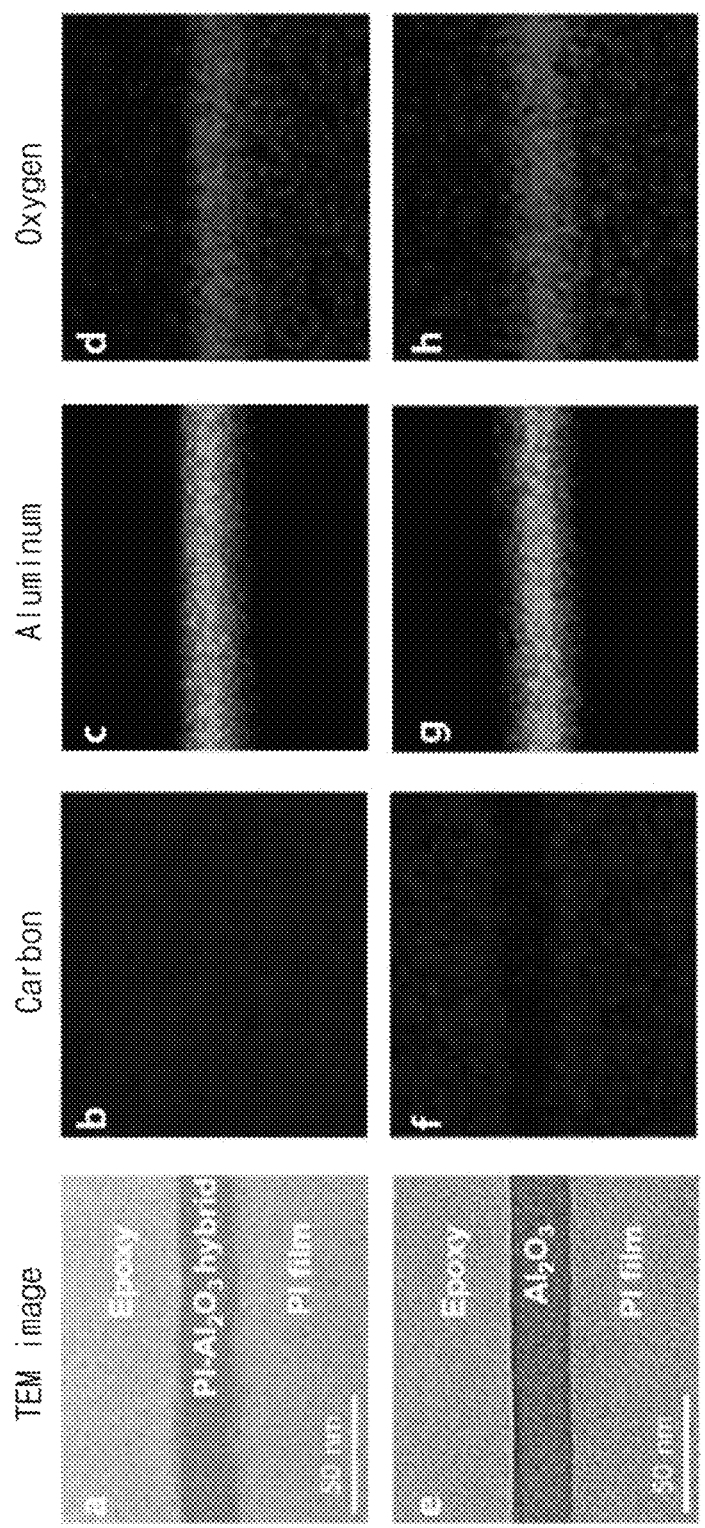

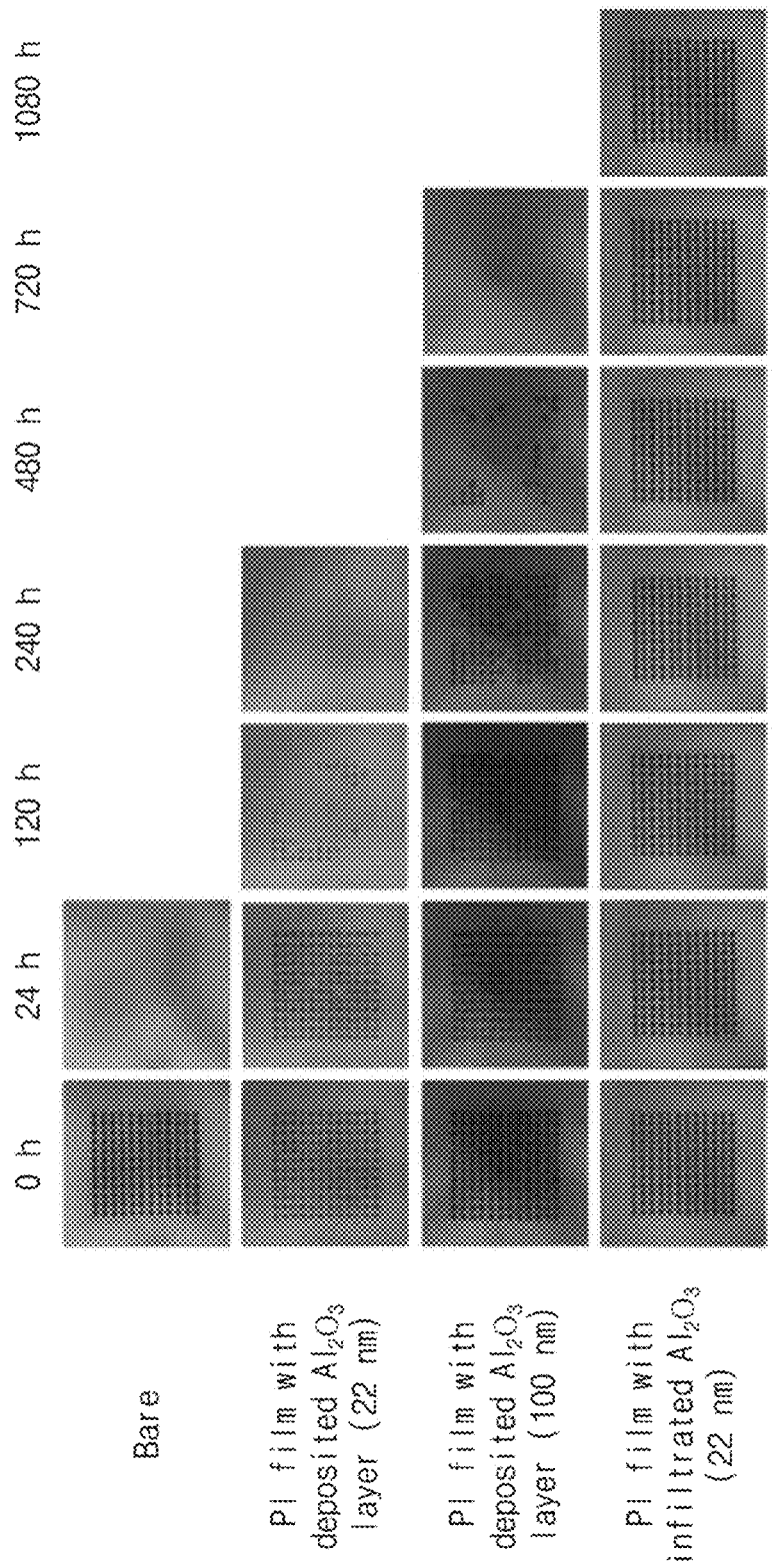

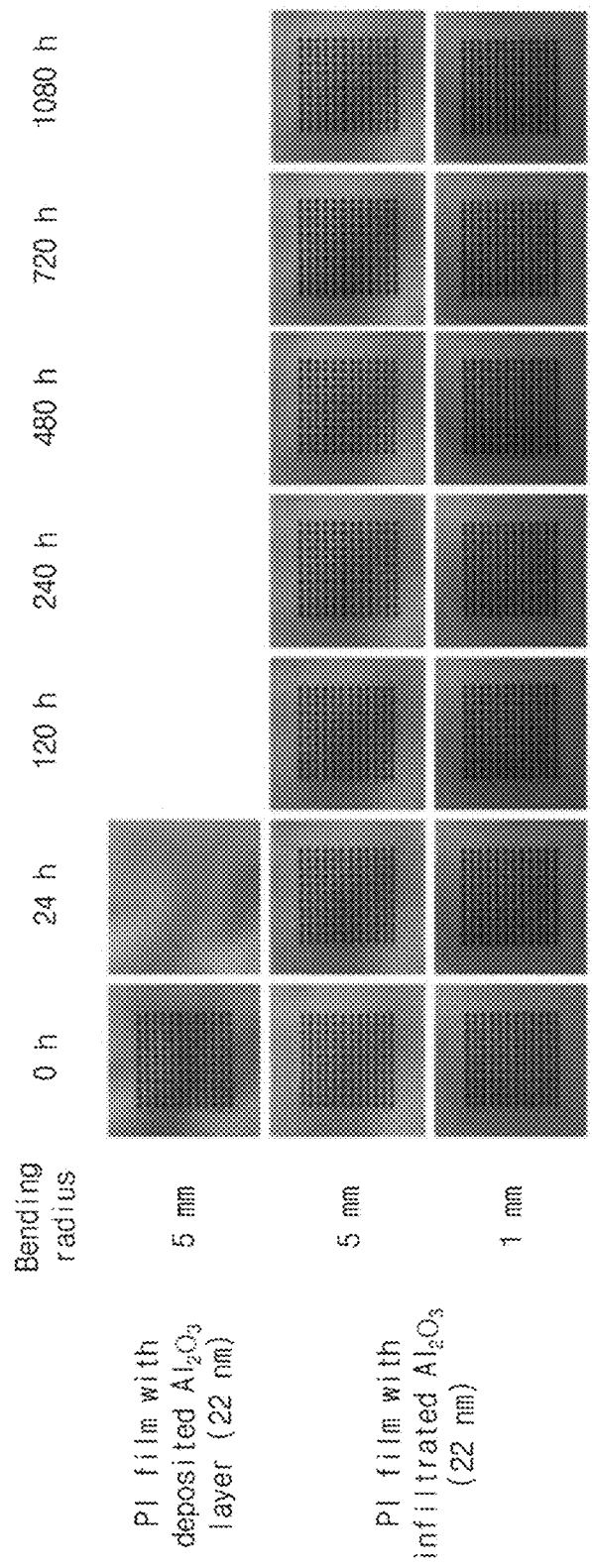
[Fig. 5]

[Fig. 6]
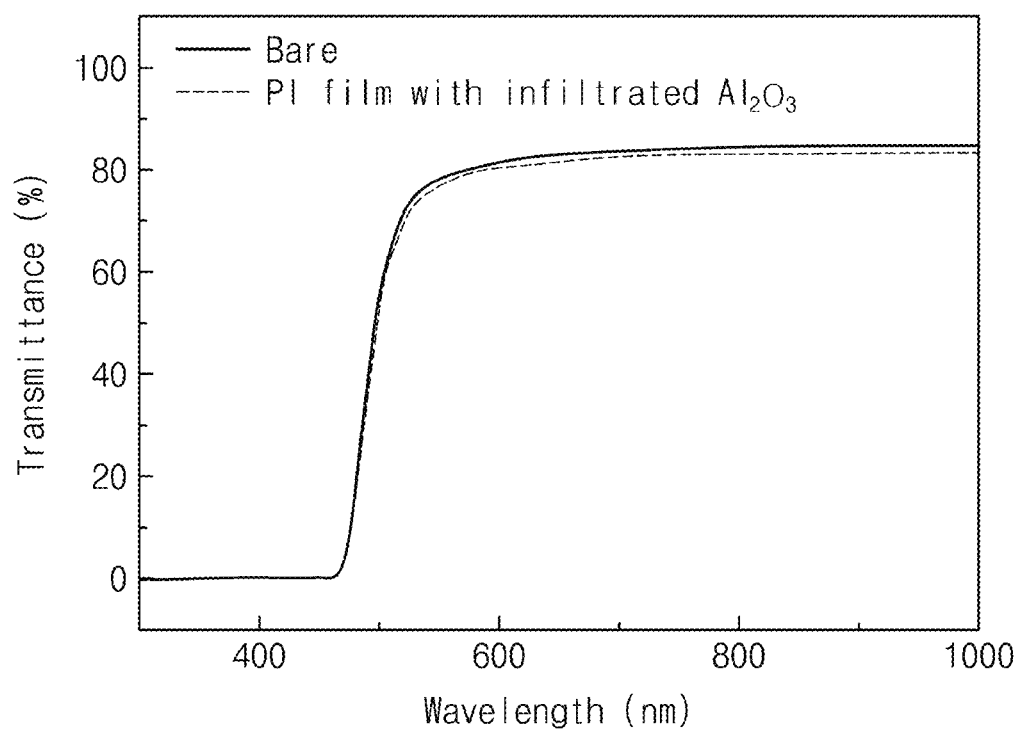

[Fig. 7]

| | Bare | 1 mm bending x 100 |
|---|---|---|
| PI film with deposited pure $Al_2O_3$ | | |
| PI film with infiltrated $Al_2O_3$ | | |

[Fig. 8]

| Temperature(°C) | 80 | | | 100 | | | 120 | | | 150 | | | |
|---|---|---|---|---|---|---|---|---|---|---|---|---|---|
| Pressure (Torr) | 1 | 3 | 5 | 9 | 3 | 3 | 5 | 9 | 1 | 3 | 5 | 9 | 1 | 3 | 5 | 9 |
| Exposing time(S) | | | | | | | | | | | | | | | | |
| 50 | | | | | | | | | | | | | | | | |
| 100 | | | | | | | | | | | | | | | | |
| 200 | | | | | | | | | | | | | | | | |
| 400 | | | | | | | | | | | | | | | | |
| 800 | | | | | | | | | | | | | | | | |

| Depth (nm) | < 15 | 15-20 | 20-25 | 25-30 | > 30 |
|---|---|---|---|---|---|

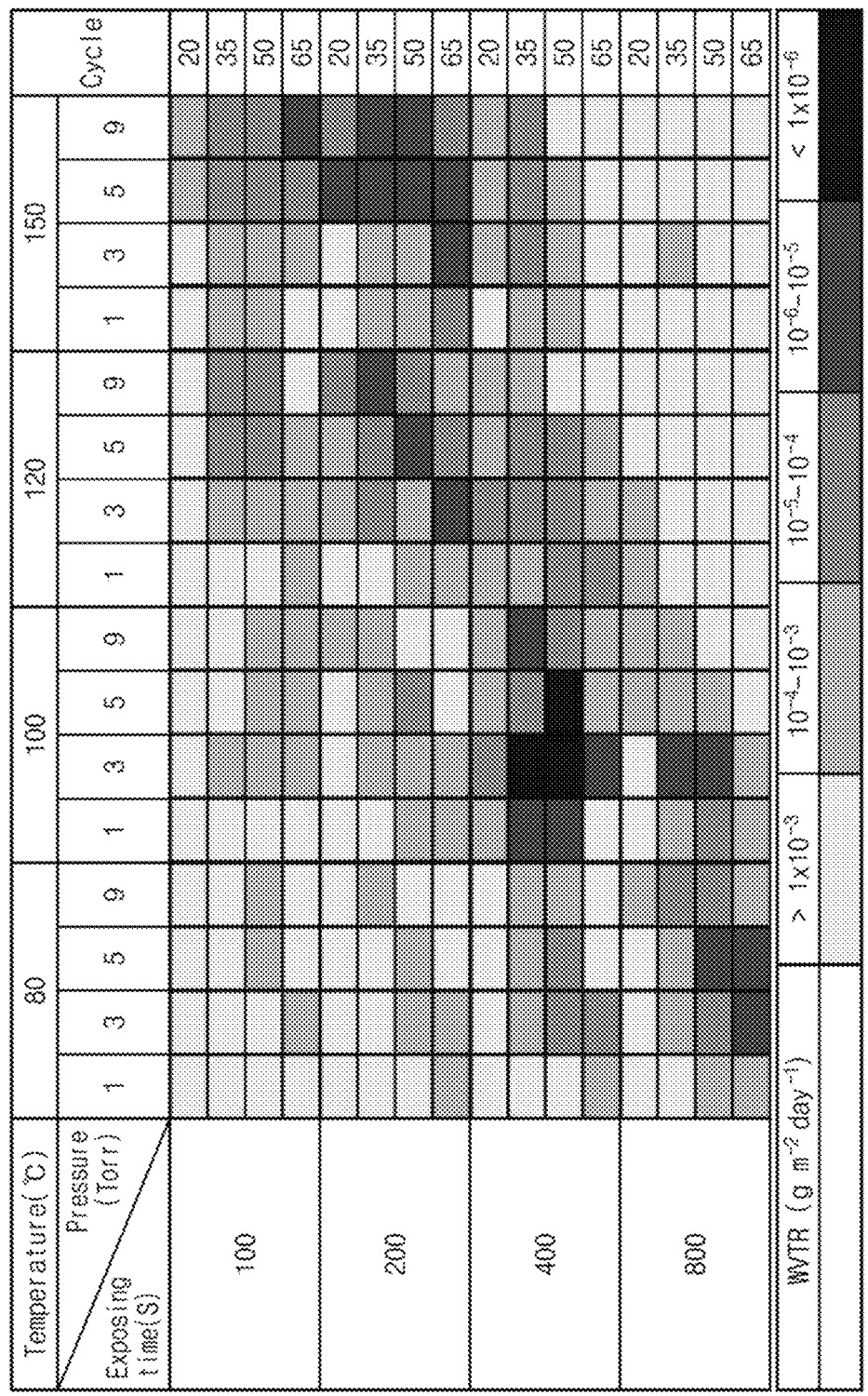
[Fig. 9]

[Fig. 10]
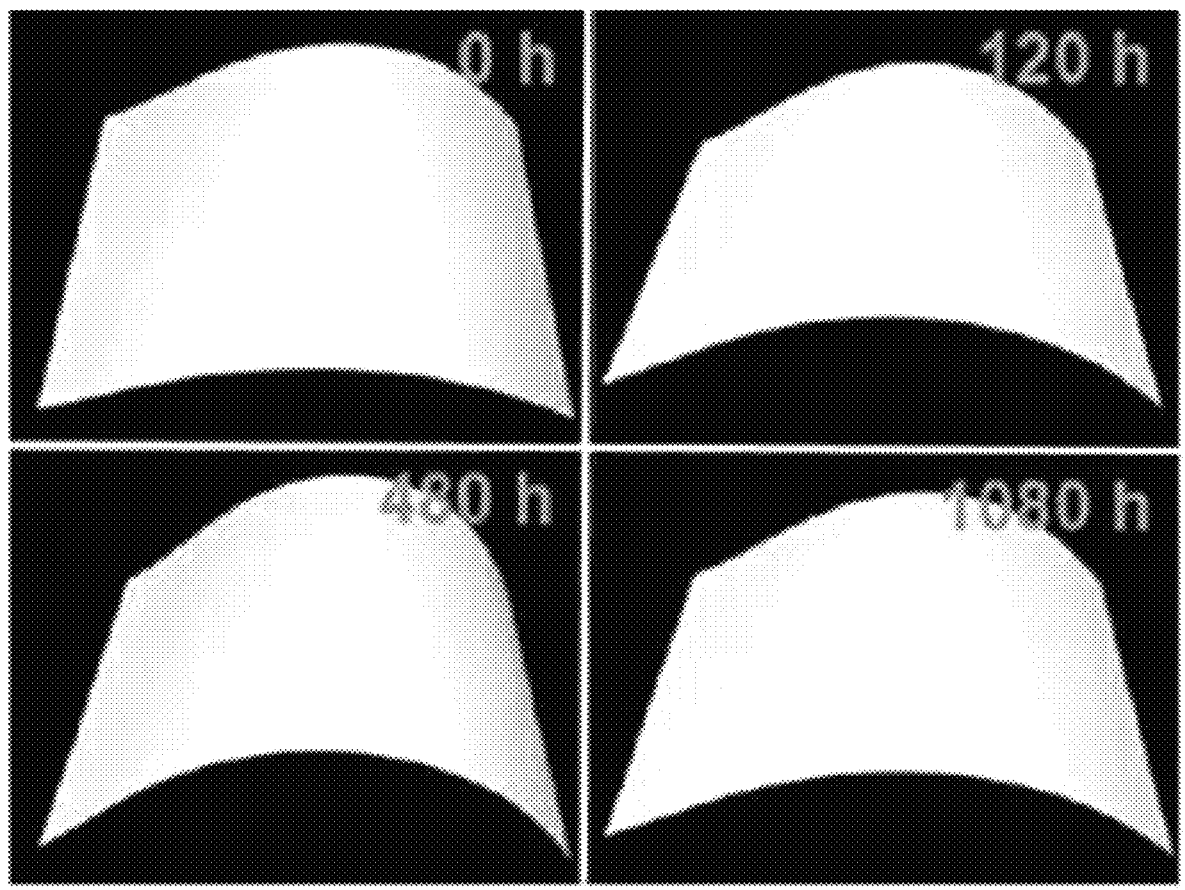

BARRIER, BARRIER MANUFACTURING METHOD, DISPLAY INCLUDING BARRIER, AND METHOD OF MANUFACTURING DISPLAY INCLUDING BARRIER

BACKGROUND OF THE PRESENT INVENTION

Field of the Present Invention

The present invention relates to a barrier, a barrier manufacturing method, a display including the barrier, and a method of manufacturing the display including the barrier, and more specifically, to a barrier having a superior water vapor transmission rate (WVTR) characteristic, a barrier manufacturing method, a display including the barrier, and a method of manufacturing the display including the barrier.

Background of the Related Art

A barrier may generally mean a functional film for protecting the lifespan and performance of a product by blocking oxygen and/or moisture. Since it has an object of protecting the lifespan and performance of a product, its utilization area is also diverse, such as medicines, electronic products, display products and the like, as well as food wrapping, and a characteristic of blocking moisture and oxygen of diverse ranges is required according to usage of each product.

Generally, a barrier film has a wide range of requirements for vapor permeability according to use environments, such as $10^{-1}$ g/m²/day or lower for a food wrapping material, $10^{-2}$ g/m² day for a vacuum heat insulator envelop, and 1 to $10^{-5}$ g/m²/day for a solar cell back sheet or a dye-sensitized solar soil cell (DSSC).

Particularly, in the case of an organic light-emitting diode (OLED) display spotlighted as a next-generation display, it is known that a high WVTR characteristic of $10^{-6}$ g/m²/day or lower is required to protect a light emitting element, as well as a thin film transistor (TFT).

Therefore, a glass encapsulation technique has been studied as a technique of a barrier for a display. The glass encapsulation technique means a technique of fixing OLED elements between two glasses configured as a substrate and a cover and tightly sealing them with glass powder using laser melting or a UV adhesive. However, since the glass encapsulation technique uses a glass, it cannot provide a characteristic of flexibility.

In addition, a thin film encapsulation (TFE) technique is studied as a technique of a barrier for a display. The thin film encapsulation technique constructs a structure of sequentially stacking an inorganic material and an organic material. Although eleven layers are stacked in the early stage, it has been reduced to three layers recently as the technique is developed, and since the technique has an advantage of encapsulating at a small thickness, it is actively studied. However, since the thin film encapsulation technique should repeatedly deposit organic and inorganic thin films, it is known to have a long processing time, and there is a limit in that the thin film is too thick to be flexible.

In addition, a technique of coating a barrier on at least one side of a flexible substrate, e.g., a polyimide (PI) substrate, of a flexible display is also studied as a kind of the encapsulation technique. However, the existing studies have a limit in providing a superior WVTR, and although a WVTR characteristic is provided, it needs to be improved in that the substrate is thick.

SUMMARY OF THE PRESENT INVENTION

An object of the present invention is to provide a barrier having a superior WVTR characteristic, a barrier manufacturing method, a display including the barrier, and a method of manufacturing the display including the barrier.

Another object of the present invention is to provide a barrier that is thin while having a superior WVTR characteristic, a barrier manufacturing method, a display including the barrier, and a method of manufacturing the display including the barrier.

Another object of the present invention is to provide a barrier of superior flexibility while having a superior WVTR characteristic, a barrier manufacturing method, a display including the barrier, and a method of manufacturing the display including the barrier.

Another object of the present invention is to provide a barrier of superior transmittance while having a superior WVTR characteristic, a barrier manufacturing method, a display including the barrier, and a method of manufacturing the display including the barrier.

The technical problems to be solved by the present invention are not limited to the problems described above.

A barrier according to an embodiment of the present invention may include: a polymer configured of a plurality of first atoms; and an inorganic material configured of a plurality of second atoms and coexisting with the organic material, wherein an atomic planar density defined by the number of atoms per cm² of the first atoms and the second atoms may exceed $1.9 \times 10^{17}$ atoms/cm².

According to an embodiment, the atomic planar density may be $2.2 \times 10^{17}$ or higher.

According to an embodiment, the atomic planar density may be $2.4 \times 10^{17}$ or higher.

According to an embodiment, the first atoms and the second atoms may provide a water vapor transmission rate (WVTR) of $10^{-6}$ (gm$^{-2}$ day$^{-1}$) or lower.

According to an embodiment, the polymer and the inorganic material may be chemically bonded.

According to an embodiment, the first atoms may form a chain, and the second atoms may be positioned in free volume that is a space other than the chain formed by the first atoms.

According to an embodiment, the first atom may include a carbon atom, and the second atom may include a metal atom.

According to an embodiment, the second atoms may infiltrate from a surface of the polymer into a subsurface of the polymer.

According to an embodiment, the inorganic material may be a metal oxide, and the second atoms may include metal atoms and oxygen atoms.

According to an embodiment, a barrier may be configured of a plurality of atoms, wherein an atomic planar density defined by the number of atoms per cm² of the plurality of atoms may exceed $1.9 \times 10^{17}$ atoms/cm².

A method of manufacturing a barrier according to an embodiment of the present invention may include the steps of: preparing a base substrate having a bond chain and free volume inside a chamber; providing a precursor gas inside the free volume; exposing, after providing the precursor gas, the precursor gas at a predetermined first pressure for a predetermined time while the chamber is tightly sealed;

purging the precursor gas; providing a reaction gas inside the free volume; exposing, after providing the reaction gas, the reaction gas at a predetermined second pressure for a predetermined time while the chamber is tightly sealed; and purging the reaction gas.

According to an embodiment, the precursor gas may infiltrate into the free volume of the base substrate by the step of exposing the precursor gas at a first pressure.

According to an embodiment, the polymer may have a carbon-oxygen bond of carbon atoms and oxygen atoms; the precursor gas may include a metallic precursor gas of a gas phase including metal atoms; and the precursor gas may infiltrate into the free volume of the base substrate and forms a carbon-oxygen-metal bond.

According to an embodiment, the reaction gas may infiltrate into the free volume of the base substrate by the step of exposing the reaction gas at a second pressure.

According to an embodiment, the polymer may have a carbon-oxygen bond of carbon atoms and oxygen atoms; the metallic precursor gas may include metal atoms; the precursor gas may infiltrate into the free volume of the base substrate and form a carbon-oxygen-metal bond by the step of exposing the precursor gas at a first pressure; and the reaction gas may infiltrate into the free volume of the base substrate and form a metal oxide bond by the step of exposing the reaction gas at a second pressure.

A display according to an embodiment of the present invention may include: a substrate; a light emitting element layer including an organic light emitting layer provided on the substrate and a driving layer for controlling light emission of the organic light emitting layer; and a barrier provided at least on one side of the substrate, wherein an atomic planar density of the barrier defined by the number of atoms per $cm^2$ may exceed $1.9 \times 10^{17}$ $atoms/cm^2$.

According to an embodiment, the barrier may include a first material configured of first atoms and a second material configured of second atoms and coexisting with the first material, and an atomic planar density defined by the number of atoms per $cm^2$ of the first atoms and the second atoms may exceed $1.9 \times 10^{17}$ $atoms/cm^2$.

According to an embodiment, the first material may form a first material layer, and the second material may be formed in a subsurface of the first material layer.

A method of manufacturing a display according to an embodiment of the present invention may include the steps of: preparing a glass substrate; forming a barrier at least on one side of the glass substrate; and forming a light emitting element layer including an organic light emitting layer provided on the glass substrate and a driving layer for controlling light emission of the organic light emitting layer, wherein the step of forming a barrier includes the steps of: providing a metallic precursor gas; exposing the metallic precursor gas at a predetermined pressure; purging the metallic precursor gas; providing a reaction gas; exposing the reaction gas at a predetermined pressure; and purging the reaction gas, and at least one among the step of exposing the metallic precursor gas at a predetermined pressure and the step of exposing the reaction gas at a predetermined pressure may control a processing condition to have a processing pressure of 1 to 9 Torr, a processing temperature of 80 to 120 degrees, and a chamber sealing time of 200 and 800 seconds.

According to an embodiment, an atomic planar density of the barrier defined by the number of atoms per $cm^2$ may exceed $1.9 \times 10^{17}$ $atoms/cm^2$.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 1(a) and 1(b) are views showing a barrier according to an embodiment of the present invention.

FIG. 2 is a flowchart illustrating a method of manufacturing a barrier according to an embodiment of the present invention.

FIG. 3 is a view showing organic-inorganic coexistence of a barrier according to an embodiment of the present invention.

FIG. 4 is a view of an experiment result showing that a barrier according to an embodiment of the present invention has a superior WVTR characteristic.

FIGS. 5 and 6 are views of an experiment result showing that a barrier according to an embodiment of the present invention has a superior WVTR characteristic and a high flexibility characteristic.

FIG. 7 is a view of an experiment result showing that a barrier according to an embodiment of the present invention has a superior WVTR characteristic and a high transmittance characteristic.

FIG. 8 is a view of an experiment result showing the effect influenced by a process variable from the viewpoint of infiltration depth in relation to a method of manufacturing a barrier according to an embodiment of the present invention.

FIG. 9 is a view of an experiment result showing the effect influenced by a process variable from the viewpoint of WVTR characteristic in relation to a method of manufacturing a barrier according to an embodiment of the present invention.

FIG. 10 is a view of an experiment result showing the characteristic of a display to which a barrier according to an embodiment of the present invention is applied.

DESCRIPTION OF SYMBOLS

90: Polymer
100: Barrier
120: Inorganic material

DETAILED DESCRIPTION OF THE PREFERRED EMBODIMENT

Hereafter, the preferred embodiments of the present invention will be described in detail with reference to the accompanying drawings. The spirit of the present invention is not limited to the embodiments described herein and may be specified in another form. Rather, the embodiments introduced herein are provided to make the disclosed contents complete and perfect and to sufficiently transfer the spirit of the present invention to those skilled in the art.

In this specification, when an element is referred to as being on another element, it can be directly formed on another element or disposed with the intervention of a third element. In addition, in the drawings, thicknesses of films and areas are exaggerated for effective explanation of the technical contents.

In addition, although the terms such as a first, a second, a third and the like are used in the diverse embodiments of this specification to describe various elements, these elements should not be limited by these terms. These terms are only used to distinguish one element from another. Accordingly, an element mentioned as a first element may be mentioned as a second element in another embodiment. Each embodiment described and illustrated herein also includes a detailed embodiment thereof. In addition, the term 'and/or' in this specification is used as a meaning including at least one among the elements arranged before and after.

In the specification, a singular expression includes a plural expression unless the context clearly indicates otherwise. In addition, the terms such as "include" or "have" are to specify the presence of the features, numerals, steps, components, or a combination thereof stated in this specification, and it should not be understood to preclude the presence or addition of one or more other features, numerals, steps, components or a combination thereof. In addition, "connect" in this specification is used as a meaning including both indirect connection and direction connection of a plurality of components.

In addition, in describing the operating principles of the preferred embodiments of the present invention in detail, if already known functions or specific description of constitution related to the present invention may make the spirit of the present invention unclear, detailed description thereof will be omitted.

FIGS. 1(a) and 1(b) are views showing a barrier according to an embodiment of the present invention.

FIG. 1(a) shows a general polymer.

A polymer 90 does not have a limit in the material type and, for example, may be polyimide. When the polymer 90 is configured of polyimide, the polymer 90 may be configured of carbon (C), oxygen (O), nitrogen (N) and hydrogen (H) elements. These elements may form a polymer chain. In addition, a free volume 92 defined as a remaining space of the polymer chain may be formed inside the polymer 90.

FIG. 1(b) shows a barrier according to an embodiment of the present invention. Referring to FIG. 1(b), a barrier 100 may be configured of the polymer 90 shown in FIG. 1(a) and an inorganic material 120 infiltrated into the free volume inside the polymer 90. For example, the inorganic material may be configured of a metal oxide, more specifically, an aluminum oxide ($Al_2O_3$).

The barrier according to an embodiment of the present invention may be manufactured by infiltrating an inorganic material into the free volume 92 of the polymer. That is, as the inorganic material 120 infiltrates into the free volume 92 of the polymer 90 shown in FIG. 1(a), the overall thickness T of the polymer 90 may be constant. The inorganic material 120 infiltrates into the free volume 92 of the polymer 90 and may chemically bond to the polymer 90. From a different viewpoint, the polymer 120 may not form a layer separate from the polymer 90, but coexist inside the polymer 90.

The barrier according to an embodiment of the present invention is configured of a plurality of atoms, and the atomic planar density defined by the number of atoms per $cm^2$ of the plurality of atoms may exceed $1.9 \times 10^{17}$. Specifically, the barrier 100 according to an embodiment of the present invention may include a polymer 90 configured of a plurality of first atoms and an inorganic material 120 configured of a plurality of second atoms and coexisting together with the organic material. At this point, the atomic planar density defined by the number of atoms per $cm^2$ of the first atoms and the second atoms may exceed $1.9 \times 10^{17}$.

That the atomic planar density exceeds $1.9 \times 10^{17}$ means that a sum of the number of the first atoms configuring the polymer 90, e.g., carbon atoms, oxygen atoms and nitrogen atoms, and the number of the second atoms configuring the inorganic material 120, e.g., aluminum atoms and oxygen atoms, exceeds $1.9 \times 10^{17}$ atoms/$cm^2$.

According to an embodiment, the atomic planar density according to an embodiment of the present invention may be $2.2 \times 10^{17}$ atoms/$cm^2$ or higher, preferably, $2.4 \times 10^{17}$ atoms/$cm^2$ or higher. That is, the barrier according to an embodiment of the present invention may have a very high atomic planar density. Since the barrier according to an embodiment of the present invention has a high atomic planar density, a WVTR characteristic of $10^{-6}$ g/$m^2$/day or lower (when the atomic planar density is $2.2 \times 10^{17}$ atoms/$cm^2$ or higher), furthermore, a WVTR characteristic of $10^{-7}$ g/$m^2$/day or lower (when the atomic planar density is $2.4 \times 10^{17}$ atoms/$cm^2$ higher) can be provided.

According to the conventional technique, although a polymer such as polyimide is applied to a flexible substrate of a display, it does not provide a superior encapsulation characteristic. It is since that the polymer has free volume therein as described above, and a path of infiltrating moisture and/or oxygen is provided through the free volume. Therefore, conventionally, the encapsulation performance is achieved in a method of alternately stacking an organic layer and an inorganic layer separate from the organic layer. It has been tried to achieve the encapsulation performance using that although there is free volume inside the organic layer and the inorganic layer, the path of infiltrating moisture and/or oxygen by the free volume is disconnected when a plurality of layers is alternately stacked.

However, according to an embodiment of the present invention, the inside of the barrier can be highly compact by infiltrating an inorganic material into the free volume inside the organic material. That is, the atomic planar density can be drastically increased. That the atomic planar density is drastically increased means that the free volume inside the organic material is removed. Accordingly, as the path of infiltrating moisture and/or oxygen is removed, a superior WVTR characteristic can be provided. In other words, since a dense matrix is formed by the atoms configuring the polymer and the atoms configuring the inorganic material, infiltration of moisture and/or oxygen is minimized.

In addition, the conventional encapsulation technique is disadvantageous in that the thickness increases as the organic layer and the inorganic layer are alternately stacked, whereas thickness of a barrier according to an embodiment of the present invention can be minimized since the polymer and the inorganic material coexist. That is, the barrier according to an embodiment of the present invention may provide a superior flexibility characteristic owing to the small thickness, together with the superior WVTR characteristic.

In addition, the barrier according to an embodiment of the present invention may have a superior transmittance characteristic, together with the superior WVTR characteristic and the superior flexibility characteristic.

The barrier according to an embodiment of the present invention has been described above with reference to FIGS. 1(a) and 1(b). Hereinafter, a method of manufacturing a barrier according to an embodiment of the present invention will be described with reference to FIG. 2.

FIG. 2 is a flowchart illustrating a method of manufacturing a barrier according to an embodiment of the present invention.

Referring to FIG. 2, a method of manufacturing a barrier according to an embodiment of the present invention may include at least one step among the steps of: preparing a base substrate having a bond chain and free volume inside a chamber (step S110); providing a precursor gas inside the free volume (step S120); exposing, after providing the precursor gas, the precursor gas at a predetermined first pressure for a predetermined time while the chamber is tightly sealed (step S130); purging the precursor gas (step S140); providing a reaction gas inside the free volume (step S150); exposing, after providing the reaction gas, the reaction gas at a predetermined second pressure for a predetermined time while the chamber is tightly sealed (step S160); and purging the reaction gas (step S170).

Hereinafter, it will be described assuming that the polymer according to an embodiment of the present invention is polyimide, and the inorganic material is an aluminum oxide. Hereinafter, each of the steps will be described.

At step S110, a base substrate having a bond chain and free volume may be provided inside a chamber. Here, the base substrate may mean a polyimide substrate. As described above, the polyimide substrate may have a bond chain configured of first atoms and free volume that is a remaining space.

At step S120, a TMA precursor gas may be provided inside the free volume of the base substrate. According to an embodiment, the precursor gas may be provided through an inlet while an outlet, among the inlet and the outlet of the chamber, is closed.

According to an embodiment, the TMA precursor gas may be provided in a gas phase state. This is considering that the TMA precursor gas in the gas phase state may further smoothly infiltrate into the subsurface of the base substrate.

An evacuation process may be performed as a preprocessing process before step S120 is performed. The evacuation process may be performed for, for example, fifteen seconds.

After the precursor gas is provided at step S130, the inside of the chamber may be tightly sealed. In other words, the inlet of the chamber may be closed while the pressure inside the chamber has increased as the precursor gas flows in at step S120. Accordingly, the inside of the chamber may be provided in a tightly sealed state. When a predetermined time is elapsed while the inside of the chamber is in a state tightly sealed at a high pressure, the precursor gas may infiltrate into the free volume of the base substrate using the chamber pressure as a driving force. Accordingly, a carbon-oxygen-metal (aluminum) bond may be formed as a carbon-oxygen chain and the TMA precursor gas forming the polyimide substrate react.

For example, the temperature inside the chamber at step S130 may be 80 to 150 degrees. In addition, the chamber pressure generated by tightly sealing the chamber at step S130 may be 1 to 9 Torr. In addition, the time of exposing the base substrate to the metallic precursor gas while the chamber is tightly sealed at step S130 may be 50 to 800 seconds.

The precursor gas may be purged at step S140. An inert gas, for example, argon gas Ar, may be used for the purge. For example, the purge may be performed for 400 seconds.

The reaction gas may be provided at step S150. For example, the reaction gas may be water. According to an embodiment, the reaction gas may be provided through the inlet while the outlet, among the inlet and the outlet of the chamber, is closed.

According to an embodiment, the reaction gas may be provided in a gas phase state. This is considering that the reaction gas in the gas phase state may further smoothly infiltrate into the subsurface of the base substrate.

An evacuation process may be performed as a preprocessing process before step S150 is performed. The evacuation process may be performed for, for example, fifteen seconds.

After the reaction gas is provided at step S160, the inside of the chamber may be tightly sealed. In other words, the inlet of the chamber may be closed while the pressure inside the chamber has increased as the reaction gas flows in at step S150. Accordingly, the inside of the chamber may be provided in a tightly sealed state. When a predetermined time is elapsed while the inside of the chamber is in a state tightly sealed at a high pressure, the reaction gas may infiltrate into the free volume of the base substrate using the chamber pressure as a driving force. Accordingly, the reaction gas may react with methyl aluminum formed in the previous step and form an aluminum oxide.

For example, the temperature inside the chamber at step S160 may be 80 to 150 degrees. In addition, the chamber pressure generated by tightly sealing the chamber at step S160 may be 1 to 9 Torr. In addition, the time of exposing the base substrate to the reaction gas while the chamber is tightly sealed at step S160 may be 50 to 800 seconds.

The reaction gas may be purged at step S170. An inert gas, for example, argon gas Ar, may be used for the purge. For example, the purge may be performed for 400 seconds.

According to an embodiment, steps S110 to S170 may be performed at a low temperature of 150 degrees or lower.

Steps S120 to S170 may be performed repeatedly. For example, the steps may be repeatedly performed 20 to 65 times. As the number of repeatedly performing the steps increases, much more inorganic materials may be deposited on the free volume of the polymer.

Accordingly, a PI-$Al_2O_3$ hybrid barrier according to an embodiment of the present invention may be manufactured.

A method of manufacturing a barrier according to an embodiment of the present invention has been described above. Hereinafter, the characteristics of the barrier according to an embodiment of the present invention will be described with reference to FIGS. 3 to 7.

FIG. 3 is a view showing organic-inorganic coexistence of a barrier according to an embodiment of the present invention, FIG. 4 is a view of an experiment result showing that a barrier according to an embodiment of the present invention has a superior WVTR characteristic, FIGS. 5 and 6 are views of an experiment result showing that a barrier according to an embodiment of the present invention has a superior WVTR characteristic and a high flexibility characteristic, and FIG. 7 is a view of an experiment result showing that a barrier according to an embodiment of the present invention has a superior WVTR characteristic and a high transmittance characteristic.

For the experiment, a barrier according to an embodiment of the present invention (hereinafter, referred to as embodiment 1) and a comparative example 1 are prepared as described below.

Embodiment 1

First, a polyimide substrate having a thickness of 20 um is prepared as a base substrate. After loading the polyimide substrate in the chamber, the outlet of the chamber is closed, and a TMA precursor gas is provided through the inlet for 13 seconds so that the pressure inside the chamber reaches 3 Torr. Then, the inlet of the chamber is closed, and the state of tightly sealing the inside of the chamber is maintained for 400 seconds. Then, the chamber is opened and purged using argon gas. After the purge, the outlet of the chamber is closed and $H_2O$ is supplied through the inlet so that the pressure inside the chamber reaches 3 Torr. Then, the inlet of the chamber is closed, and the state of tightly sealing the inside of the chamber is maintained for 400 seconds. Then, the chamber is opened and purged using argon gas. At this point, the purge is accomplished by flowing argon gas at a speed of 200 sccm. Each of the processing steps has been performed at 100 degrees. A barrier is manufactured by infiltrating $Al_2O_3$ having a thickness of 22 nm into the subsurface of the polyimide substrate by repeating each of the steps.

Comparative Example 1

First, a polyimide substrate having a thickness of 20 um is prepared as a base substrate. Generally, $Al_2O_3$ is deposited on the polyimide substrate through an atomic layer deposition (ALD) process. That is, 2 seconds of TMA precursor gas supply, 15 seconds of argon purge, 2 seconds of $H_2O$ supply and 30 seconds of argon purge have been conducted. That is, in the comparative example, the step of exposing the polyimide substrate to a precursor and/or reaction gas at a high pressure while the chamber is tightly sealed is omitted. Each of the processing steps is performed at 100 degrees and 0.3 Torr. A separate $Al_2O_3$ layer having a thickness of 22 nm is formed on the polyimide substrate by repeating each of the processing steps.

FIG. 3a shows a TEM picture of embodiment 1 of the present invention, and FIGS. 3b to 3d show a result of analyzing EDS components of embodiment 1 by thickness. FIG. 3e shows a TEM picture of comparative example 1, and FIGS. 3g to 3h show a result of analyzing EDS components of comparative example 1 by thickness.

Referring to FIGS. 3a to 3d, in the case of embodiment 1, it is confirmed that even a carbon peak, as well as aluminum and oxygen peaks configuring $Al_2O_3$, is observed in the area marked as PI-$Al_2O_3$ hybrid. That is, it is confirmed that $Al_2O_3$ infiltrates and coexists in the subsurface of the polyimide substrate having carbon. In other words, it is known that $Al_2O_3$ has infiltrated in the free volume in the subsurface of the polyimide substrate.

In contrast, referring to FIGS. 3e to 3h, in the case of comparative example 1, it is confirmed that only the aluminum and oxygen peaks configuring $Al_2O_3$ are observed and a carbon peak is not observed in the area marked as $Al_2O_3$ in FIG. 3e. That is, it is confirmed that in comparative example 1, unlike embodiment 1, $Al_2O_3$ is deposited without regard to the polyimide substrate.

Therefore, it is experimentally confirmed that $Al_2O_3$ has infiltrated into the subsurface of the polyimide substrate by steps S130 and S160 in the method of manufacturing a barrier according to an embodiment of the present invention.

In addition, in embodiment 1, an atomic planar density is calculated using a Rutherford backscattering spectrometry (RBS) analysis method and a RUMP software simulation package. According thereto, it is confirmed that the chemical composition of the barrier according to embodiment 1 is $Al_{2.00}O_{3.79}C_{4.35}N_{0.495}H_{2.24}$. In addition, it is confirmed that the atomic planar density at this point is $2.4 \times 10^{17}$ atoms/$cm^2$. It is analyzed that the superior atomic planar density of embodiment 1 is owing to coexistence of the polymer and the inorganic material as shown in the experiment result of FIG. 3. Since a high atomic planar density directly relates to improvement of the WVTR characteristic, a result of a WVTR characteristic experiment will be described with reference to FIG. 4.

FIG. 4 is a view of an experiment result showing that a barrier according to an embodiment of the present invention has a superior WVTR characteristic.

For the WVTR characteristic experiment, as many Ca dots as 144 are prepared on a glass substrate. Then, a prepared sample barrier is attached on the Ca dots using epoxy. The 'Bare' on the top of FIG. 4 shows a result of the barrier characteristic experiment over time on the polyimide substrate without depositing $Al_2O_3$ and having a thickness of 20 um, the 'PI film with deposited $Al_2O_3$ layer (22 nm)' in the second line of FIG. 4 shows a result of the barrier characteristic experiment over time on comparative example 1, the 'PI film with deposited $Al_2O_3$ layer (100 nm)' in the third line of FIG. 4 shows a result of the barrier characteristic experiment over time when the thickness of a separate $Al_2O_3$ layer is 100 nm as a processing condition of comparative example 1, and the 'PI film with infiltrated $Al_2O_3$ layer (22 nm)' in the fourth line of FIG. 4 shows a result of the barrier characteristic experiment over time on embodiment 1.

These samples are exposed in an environment of 85 degrees and 85% RH for an accelerated aging experiment.

As shown in FIG. 4, in the case of 'Bare', it is confirmed that moisture has infiltrated after 24 hours, and in the case of comparative example 1, moisture begins to infiltrate from the 24-th hour, and the Ca dots are completely invisible after 240 hours. In the case of 'PI film with deposited $Al_2O_3$ layer (100 nm)', moisture also begins to infiltrate from the 24-th hour, and the Ca dots are completely invisible after 720 hours.

In contrast, in the case of embodiment 1, it is known that Ca dots are clearly seen even when the 1080-th hour is reached, and this means that moisture cannot infiltrate.

A WVTR characteristic value is calculated on the basis of a result of Ca corrosion test in an environment of 85 degrees/85% RH and 70 degrees/90% RH. As a result of the calculation, in the case of embodiment 1 of the present invention, it is confirmed that the barrier has a WVTR characteristic of $10^{-7}$ $g/m^2/day$ or lower.

The superior WVTR characteristic according to an embodiment of the present invention has been described above with reference to FIG. 4. Hereinafter, the superior flexibility characteristic of an embodiment of the present invention will be described with reference to FIGS. 5 and 6.

FIGS. 5 and 6 are views of an experiment result showing that a barrier according to an embodiment of the present invention has a superior WVTR characteristic and a high flexibility characteristic.

For the experiment of comparing the flexibility characteristic, the barrier of comparative example 1 is bent 10,000 times at a curvature radius of 5 mm. Then, a corrosion test is conducted on the Ca dots in an environment of 85 degrees/85% RH. As a result of the experiment, as shown on the top of FIG. 5, it is confirmed that the Ca dots are invisible at all after 24 hours are elapsed. In the case of the experiment result as shown in FIG. 4, compared with that the Ca dots are invisible at all from the 240-th hour, it is analyzed that the WVTR characteristic is further degraded after the bending experiment.

The barrier of embodiment 1 is bent 10,000 times at a curvature radius of 5 mm, which is the same environment as that of comparative example 1. Then, a corrosion test is conducted on the Ca dots in an environment of 85 degrees/85% RH. As a result of the experiment, it is confirmed that all the Ca dots are observed even after 1080 hours are elapsed. This means that in the case of embodiment 1, the barrier still has a superior WVTR even after the bending experiment.

Furthermore, the barrier of embodiment 1 is bent 10,000 times at a curvature radius of 1 mm, which is a condition more severe than the curvature radius of 5 mm. Then, a corrosion test is conducted on the Ca dots in the same environment. As a result of the experiment, it is confirmed that all the Ca dots are still observed even after 1080 hours are elapsed. This means that the WVTR characteristic of embodiment 1 is maintained well even in a severe bending environment.

It is analyzed that as the atoms configuring the inorganic material coexist with the atoms configuring the polymer in the barrier according to embodiment of the present invention, the polymer chains absorb well the deformation caused by bending, and at the same time, the inorganic material is bonded to the organic material with a superior force.

Meanwhile, referring to FIG. 6, although it is confirmed that cracks may generate when the barrier of comparative example 1 is bent 100 times at a curvature radius of 1 mm, it is confirmed that the cracks do not generate at all even after the bending test has been conducted on the barrier of comparative example 1 100 times at a curvature radius of 1 mm.

That is, it is known that the barrier according to an embodiment of the present invention has a superior mechanical strength.

It has been described above that the barrier according to an embodiment of the present invention has a superior WVTR characteristic and a superior flexibility characteristic. Hereinafter, transmittance of the barrier according to an embodiment of the present invention will be described with reference to FIG. 7.

FIG. 7 is a view of an experiment result showing that a barrier according to an embodiment of the present invention has a superior WVTR characteristic and a high transmittance characteristic.

Referring to FIG. 7, transmittance characteristics of a pure polyimide film and the barrier of embodiment 1 can be confirmed. As a result of the experiment, it is confirmed that the barrier of embodiment 1 has a transmittance of a level practically the same as that of the pure polyimide film.

That is, it is known that the barrier according to an embodiment of the present invention provides a superior transmittance characteristic, in addition to the superior WVTR characteristic, superior WVTR maintainability characteristic, and superior mechanical characteristic, even in a bending environment.

The performance characteristics of the barrier according to an embodiment of the present invention have been described above with reference to FIGS. 3 to 7. Hereinafter, the effect influenced by the processing condition in the method of manufacturing a barrier will be described with reference to FIGS. 8 and 9.

FIG. 8 is a view of an experiment result showing the effect influenced by a process variable from the viewpoint of infiltration depth in relation to a method of manufacturing a barrier according to an embodiment of the present invention. The experiment result shown in FIG. 8 is based on a case of performing steps S120 to S170 described above with reference to FIG. 2 as many as 50 times. Particularly, FIG. 8 shows the infiltration depth of the inorganic material according to the processing condition of step S130 (or step S160). The infiltration depth means how deeply $Al_2O_3$ infiltrates into the subsurface of the polyimide substrate.

Referring to FIG. 8, it is confirmed that the infiltration depth increases according to increase of the processing pressure and the chamber sealing time (exposing time). However, the processing temperature is not proportional to the infiltration depth. For example, when the chamber sealing time is 400 seconds and the processing pressure is 9 Torr, the infiltration depth is greater at a processing temperature of 100 degrees or lower, and when the processing temperature increases to be higher than the temperature, the infiltration depth is decreased rather. For another example, when the chamber sealing time is 400 seconds and the processing pressure is 3 Torr, the infiltration depth is further greater at a processing temperature of 80 degrees or lower, and when the processing temperature increases to be higher than the temperature, the infiltration depth is decreased rather.

Therefore, depth of infiltration of the inorganic material into the subsurface of the polymer can be controlled by controlling the processing pressure, the chamber sealing time and the processing temperature of the manufacturing method according to an embodiment described with reference to FIG. 2.

FIG. 9 is a view of an experiment result showing the effect influenced by a process variable from the viewpoint of WVTR characteristic in relation to a method of manufacturing a barrier according to an embodiment of the present invention. FIG. 9 shows the WVTR characteristic on the processing condition of step S130 (or step S160).

Referring to FIG. 9, it is shown that the WVTR characteristic is improved when the processing pressure is 1 to 9 Torr, the processing temperature is 80 to 150 degrees, the chamber sealing time is 100 to 800 seconds, and the number of process is 20 to 65 cycle.

Referring to FIG. 9 continuously, it is confirmed that a superior WVTR characteristic of $10^{-6}$ g/m$^2$/day or lower is provided when the processing pressure is 1 to 9 Torr, the processing temperature is 80 to 120 degrees, the chamber sealing time is 200 to 800 seconds, and the number of process is 20 to 65 cycle.

Therefore, a degree of the WVTR characteristic can be controlled by controlling the processing pressure, the chamber sealing time, and the processing temperature of the manufacturing method according to the embodiment described with reference to FIG. 2.

The barrier according to an embodiment of the present invention may be applied to a display. The display according to an embodiment of the present invention includes a substrate; a light emitting element layer including an organic light emitting layer provided on the substrate and a driving layer for controlling light emission of the organic light emitting layer; and a barrier provided at least on one side of the substrate, and the atomic planar density of the barrier may exceed $1.9 \times 10^{17}$. The display according to an embodiment of the present invention also has a superior WVTR characteristic, it will be described below with reference to FIG. 10.

For the experiment, a flexible display is manufactured. The flexible display is configured to include a barrier according to an embodiment of the present invention (embodiment 1). The manufactured flexible display is exposed in an accelerated aging environment of 85 degrees/85%. As shown in FIG. 10, it is confirmed that moisture cannot infiltrate into the display even when the accelerated aging environment is sustained for 1080 hours. This means that the barrier has a WVTR characteristic of $10^{-7}$ g/m$^2$/day even when the barrier according to an embodiment of the present invention is applied to a display. That is, it means that even when a light emitting layer and a TFT for controlling the light emitting layer are formed on the barrier, the WVTR characteristic that the barrier of embodiment 1 has is not lowered. This means that the barrier according to an embodiment of the present invention can be immediately applied to manufacturing of a flexible display.

When the flexible display is manufactured through a lift off process, a glass substrate is prepared, and a barrier according to an embodiment of the present invention may be formed on the glass substrate. Then, a light emitting layer configured of an organic material and a TFT driving element for controlling the light emitting layer may be formed. Then, an encapsulation layer for protecting the light emitting layer may be formed. It is apparent that at this point, the encapsulation layer may also be manufactured using a barrier according to an embodiment of the present invention. Then, a flexible substrate may be manufactured by lifting off the glass substrate. Meanwhile, in the case of a flexible display, a WVTR characteristic of $10^{-6}$ g/m²/day is required. In this case, the processing condition of steps S120 to S170 described with reference to FIG. 2 may be controlled in manufacturing a barrier that is applied to the flexible display. For example, the processing condition may be controlled to have a processing pressure of 1 to 9 Torr, a processing temperature of 80 to 120 degrees, a chamber sealing time of 200 and 800 seconds, and the number of process of 20 and 65 cycle. Therefore, a superior WVTR characteristic of $10^{-6}$ g/m²/day or lower may be provided (see FIG. 9). A barrier, a barrier manufacturing method, a display including the barrier, and a method of manufacturing the display including a barrier according to an embodiment of the present invention have been described above with reference to FIGS. 1 to 10.

As described above, the barrier according to an embodiment of the present invention is configured of a polymer and an inorganic material infiltrating into free volume and coexisting in the subsurface of the polymer. Since the atoms configuring the inorganic material fill the free volume in the subsurface of the polymer, the atomic planar density of the barrier drastically increases. Since the path of infiltrating moisture and/or oxygen is reduced according increase of the atomic planar density, a superior WVTR characteristic can be provided.

In addition, since the inorganic material infiltrates into the subsurface of the polymer, thickness of the barrier can be minimized compared to a case of preparing a separate layer of inorganic material outside the polymer. Accordingly, the flexibility characteristic can be improved. In addition, since flexibility of the polymer material itself is still maintained, the flexibility characteristic can be provided. That is, the barrier according to an embodiment of the present invention can be effectively applied to an electronic device which requires flexibility since the thickness is small and the flexibility of the polymer material itself can be utilized as is.

Furthermore, the barrier according to an embodiment of the present invention appears to maintain the superior WVTR characteristic even after a severe bending test, and the mechanical strength is also superior without generating a crack even after the severe bending test.

As described above, in the case of a conventional technique, when a glass substrate is used as an encapsulation layer, there is a disadvantageous limit in that the glass substrate is inflexible, and in the case of a thin film encapsulation technique, there is a disadvantageous limit in that cracks are generated in the inorganic material when the barrier is bent, and the flexibility is lowered as the thickness increases by the alternate stacking of an organic layer and an inorganic layer. In addition, in the case of a conventional technique of a method including a moisture absorbent in a polymer film, there is a limit in that a WVTR characteristic required in the field cannot be provided.

On the contrary, compared to the conventional techniques, the barrier according to an embodiment of the present invention has a noticeable effect in that a superior WVTR characteristic, a superior stability characteristic of maintaining the WVTR characteristic in a bending environment, a superior mechanical strength characteristic of not generating a crack in a bending environment, and a high transmittance characteristic are provided.

Furthermore, the barrier manufacturing method according to an embodiment of the present invention may be accomplished at a low temperature. As described above, the barrier can be manufactured at a temperature of 150 degrees or lower. Since a low temperature process is possible, variation of the characteristics of the polymer substrate can be minimized although an inorganic material infiltrates into the polymer substrate, and the effect on the other element layers can be minimized even when the barrier according to an embodiment is formed on the other element layers, e.g., an inorganic light emitting layer. In addition, since the barrier manufacturing method according to an embodiment of the present invention may be performed at a processing pressure of 1 to 9 Torr, a metallic precursor gas and/or a reaction gas may be provided in a gas phase state at a processing temperature of 80 to 150 degrees. Since the metallic precursor gas and/or the reaction gas can be provided in a gas phase state, they may easily infiltrate into the subsurface of the polymer. Accordingly, the barrier manufacturing method according to an embodiment of the present invention may provide advantages of processing at a low temperature and improving the manufacturing efficiency by providing a metallic precursor gas and/or a reaction gas in a gas phase.

In the barrier according to an embodiment of the present invention, the atomic planar density defined by the number atoms per cm² may exceed $1.9 \times 10^{17}$ atoms/cm². Accordingly, a WVTR characteristic of high level can be provided.

The barrier according to an embodiment of the present invention may maintain a superior WVTR characteristic even in a bending test.

The barrier according to an embodiment of the present invention may provide a superior mechanical strength even in a bending test.

The barrier according to an embodiment of the present invention may be configured of a first material and a second material infiltrated in the subsurface of the first material. Therefore, since the second material infiltrates in the subsurface of the first material, a small thickness can be provided.

The barrier manufacturing method according to an embodiment of the present invention may be performed in a low temperature process.

As the barrier manufacturing method according to an embodiment of the present invention provides a metallic precursor gas and/or a reaction gas in a gas phase, an inorganic material may easily infiltrate into the subsurface of a polymer.

Although the present invention has been described in detail using the preferred embodiments, the scope of the present invention is not limited to the embodiments, but it should be interpreted by the appended claims. It is to be appreciated that those skilled in the art may make a lot of changes or modifications without departing from the scope of the present invention.

What is claimed is:
1. A barrier comprising:
a polymer layer including a polymer chain configured of a plurality of first atoms; and
an inorganic material configured of a plurality of second atoms and coexisting with the polymer,
wherein the second atoms fill free volume that is a space other than the polymer chain thereby removing the free volume,
wherein an atomic planar density defined by the number of atoms per cm² of the first atoms and the second atoms exceeds $2.2 \times 10^{17}$ atoms/cm², wherein the first atoms and the second atoms provide a water vapor transmission rate (WVTR) of $10^{-6}(gm^{-2}day^{-1})$ or lower, and wherein a depth for the inorganic material to infiltrate into the polymerlayer is 20 nm or more.

2. The barrier according to claim 1, wherein the atomic planar density is $2.4 \times 10^{17}$ atoms/cm$^2$ or higher to provide WVTR of $10^{-7}$ (gm$^{-2}$ day$^{-1}$) or lower.

3. The barrier according to claim 1, wherein the polymer and the inorganic material are chemically bonded.

4. The barrier according to claim 1, wherein the first atom includes a carbon atom, and the second atom includes a metal atom.

5. The barrier according to claim 1, wherein the second atoms infiltrate from a surface of the polymer layer into a subsurface of the polymer layer.

6. The barrier according to claim 1, wherein the inorganic material is a metal oxide, and the second atoms include metal atoms and oxygen atoms.

7. A method of manufacturing the barrier of claim 1, the method comprising the steps of:
preparing a base substrate having a bond chain and free volume inside a chamber;
providing a precursor gas inside the free volume;
exposing, after providing the precursor gas, the precursor gas at a predetermined first pressure for a predetermined time while the chamber is tightly sealed;
purging the precursor gas;
providing a reaction gas inside the free volume;
exposing, after providing the reaction gas, the reaction gas at a predetermined second pressure for a predetermined time while the chamber is tightly sealed; and
purging the reaction gas.

8. The method according to claim 7, wherein the precursor gas infiltrates into the free volume of the base substrate by the step of exposing the precursor gas at a first pressure.

9. The method according to claim 7, wherein the reaction gas infiltrates into the free volume of the base substrate by the step of exposing the reaction gas at a second pressure.

10. The method according to claim 9, wherein
the base substrate includes a polymer;
the polymer has a carbon-oxygen bond of carbon atoms and oxygen atoms;
the metallic precursor gas includes metal atoms;
the precursor gas infiltrates into the free volume of the base substrate and forms a carbon-oxygen-metal bond by the step of exposing the precursor gas at a first pressure; and
the reaction gas infiltrates into the free volume of the base substrate and forms a metal oxide bond by the step of exposing the reaction gas at a second pressure.

11. A display comprising:
the barrier of claim 1; and
a light emitting element layer including an organic light emitting layer provided on the barrier and a driving layer for controlling light emission of the organic light emitting layer.

12. The barrier according to claim 1, wherein the polymer layer comprises an upper part and a lower part opposite to the upper part, and wherein the inorganic material coexists with the polymer only within the upper part of the polymer layer including an upper surface of the polymer layer.

13. The method according to claim 8, wherein
the base substrate includes a polymer;
the polymer has a carbon-oxygen bond of carbon atoms and oxygen atoms;
the precursor gas includes a metallic precursor gas of a gas phase including metal atoms; and
the precursor gas infiltrates into the free volume of the base substrate and forms a carbon-oxygen-metal bond.

* * * * *